(12) United States Patent
Pomeroy

(10) Patent No.: US 6,501,255 B2
(45) Date of Patent: Dec. 31, 2002

(54) DIFFERENTIAL CURRENT SOURCE WITH ACTIVE COMMON MODE REDUCTION

(75) Inventor: Geoffrey S. Pomeroy, Westerville, OH (US)

(73) Assignee: Lake Shore Cryotronics, Inc., Westerville, OH (US)

(*) Notice: Subject to any disclaimer, the term of this patent is extended or adjusted under 35 U.S.C. 154(b) by 0 days.

(21) Appl. No.: 09/971,274

(22) Filed: Oct. 4, 2001

(65) Prior Publication Data

US 2002/0060915 A1 May 23, 2002

Related U.S. Application Data

(60) Provisional application No. 60/252,212, filed on Nov. 21, 2000.

(51) Int. Cl.[7] .................................................. G05F 3/08
(52) U.S. Cl. ......................... 323/312; 323/280; 330/85; 330/105; 327/335
(58) Field of Search .............................. 323/233, 293, 323/303, 304, 312, 268, 269, 280, 297, 311, 353; 327/335; 330/85, 105

(56) References Cited

U.S. PATENT DOCUMENTS

| 5,021,729 A | | 6/1991 | Sutton | |
|---|---|---|---|---|
| 5,087,890 A | * | 2/1992 | Ishiguro et al. | 330/259 |
| 5,153,499 A | * | 10/1992 | Klesh | 323/280 |
| 5,465,041 A | * | 11/1995 | Sanders et al. | 323/312 |

* cited by examiner

Primary Examiner—Jeffrey Sterrett
Assistant Examiner—Gary L. Laxton
(74) Attorney, Agent, or Firm—Hodgson Russ LLP

(57) ABSTRACT

A voltage-controlled current source provides operation as either a differential current source for a floating load, or operation as a grounded current source when one end of the load is grounded. Switching between operation as a differential current source and operation as a grounded current source is automatic, and will accommodate significant lead resistance between the source and the load. Additionally, in absence of a grounded load the circuit can provide active common mode reduction using active feedback to reduce common mode voltage on the load.

6 Claims, 4 Drawing Sheets

DIFFERENTIAL CURRENT SOURCE WITH ACTIVE COMMON MODE REDUCTION

This is a non-provisional application based on provisional application No. 60/252,212, the disclosure of which is herein incorporated by reference.

FIELD OF INVENTION

The present invention relates to electrical circuits for providing current through a load impedance, where the current source is differential and provides a symmetrical, high impedance drive to the load. This type of current source is particularly useful in instrumentation that makes impedance measurements using low excitation.

BACKGROUND OF INVENTION

Many different types of current sources are known in the art. These circuits vary greatly in complexity and performance to fit their intended application. Furthermore, they are frequently modified to support unipolar or bipolar and fixed or voltage programmable operation. Instrumentation current sources generally fall into two categories, those that drive floating loads and those that drive grounded loads. The single op-amp, ideal current source (see, e.g., p.182 "The Art of Electronics", Horowitz & Hill, Cambridge University Press, 1989) is an example of a current source that drives a floating load. One problem with this type of source is that the output current is not controlled if the load is grounded to the current source common. The ideal source also produces a common mode voltage on the load that may be unwanted.

A modified Howland current source, illustrated in FIG. 1, is an example of a current source that will drive a grounded load. It was developed specifically to drive current into a load that has one end tied to the current source ground, ensuring low impedance between the load and ground. The Howland current source with its many variations and improvements has been used very successfully in instrumentation, but it does have one drawback. The current source output and return have different impedances, creating an unbalanced load. Different impedances at each end of a current source load do not create a problem for the current source in isolation, but in application there is always some stray noise coupling into the load. Most noise couples either capacitively or inductively from the environment into the current source leads. Noise can also couple through the voltage measurement circuits via their power supplies. Much of the noise couples into the load as common-mode current. Differential voltage inputs are used extensively to reject common mode voltage noise but they too are limited.

When common mode currents act on an unbalanced load, they react differently with different impedances on each side of the load to create normal mode errors that cannot be rejected by differential voltage inputs. These errors can be significant when making precision measurements or whenever the common mode voltages are large compared to the desired measurement signal. One method for balancing the load is to provide a differential current source with a symmetrical, high impedance drive to the load. An early example of a differential current drive is the circuit described in NASA Tech Brief #MSC-16475, Winter 1977. This circuit provides differential output with two identical, out of phase outputs, but drives one end of the load from zero source impedance. This effectively introduces a ground at one end of the load and will not eliminate common mode voltage errors. A second example of a differential current source, illustrated in FIG. 2, is the circuit described in U.S. Pat. No. 5,021,729. This differential current source is a practical circuit and achieves the goal of minimizing the effect of common mode voltage on precision measurements as long as the load remains floating. However, if one side of the load is grounded to the current source common there is a significant error in current output.

Thus there is a need for a new current source that has the advantages of a differential current source for floating loads but will also tolerate grounded loads.

SUMMARY OF THE INVENTION

The primary object of the present invention is to provide a new current source that operates as a differential current source when the load is floating and, upon grounding the load, will automatically operate as a grounded load current source with reduced common mode rejection.

Another objective is to ensure the load current will change only by a small, predictable amount when operation changes from one mode to another, thereby enabling the invention to be used in applications where the measurement wiring is pre-installed and difficult to change or when unintentional grounding occurs during operation.

Another objective is to create a current source that can be configured for an operation selected from the group consisting of AC operation, DC operation, unipolar operation, bipolar operation, for operation with resistive loads, for operation with reactive loads, and a combination thereof.

Another objective is that the invention can be easily modified for range selection by switching in sense resistors of different values.

To achieve these objectives, the present invention is constructed of two, substantially identical, modified Howland current sources driving the load simultaneously but out of phase with each other. The current from each half is equal to the full desired current output but they have opposite sign. An external voltage source drives one half of the current source and an amplifier is used to create an opposite phase voltage to drive the other half. The inverting amplifier can optionally be omitted if the second half of the current source is configured for inverting operation. In addition to the Howland architecture, the invention requires active feedback, to center its operation about ground. This prevents the current source output amplifiers from floating to one power supply rail or the other (e.g., active feedback comprising a means to center the operating voltage between power supply rails). The circuits used to center operation also act to reduce DC current if the current source is configured for AC operation.

The near perfect symmetry of the circuit according to the present invention allows one half to operate essentially alone if the other is grounded. Any impedance between zero and infinity can be tolerated between one half and ground, allowing for significant lead resistance or high impedance shorts between one side of the load and ground. The error in current between floating and grounded operation is limited to one half of the difference between the two halves. The current into a floating load is the average of the current that would be produced by the two halves if they were standalone. The current into a grounded load is that of the ungrounded half. This difference can be very small if a precision voltage inverter and well-matched programming resistors are used. If the load is floating, active common mode reduction can be added that uses active feedback to reduce noise induced common mode voltage on the load. Common mode voltage is sensed and fed back to intentionally bias the operating point.

When tracking common mode voltage, the current source can cancel much of its effect by creating low impedance to the common mode voltage while maintaining its typically high impedance to the load.

These and other objectives and advantages of the invention will become more apparent from the following detailed description taken in conjunction with the accompanying drawings.

DETAILED DESCRIPTION OF THE PREFERRED EMBODIMENT

Figure 1:
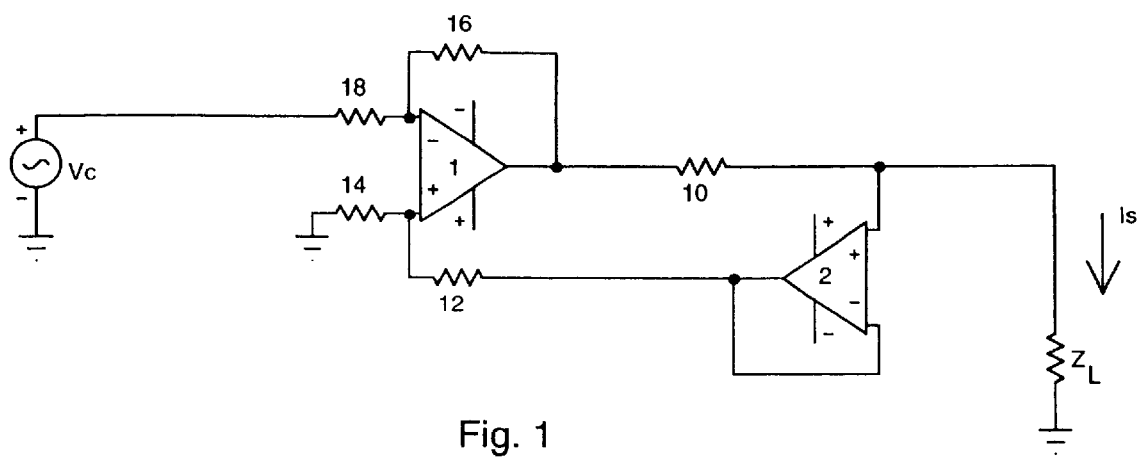
FIG. 1 is a schematic diagram of a prior art, Howland current source that can be used to drive a grounded load.
Figure 2:
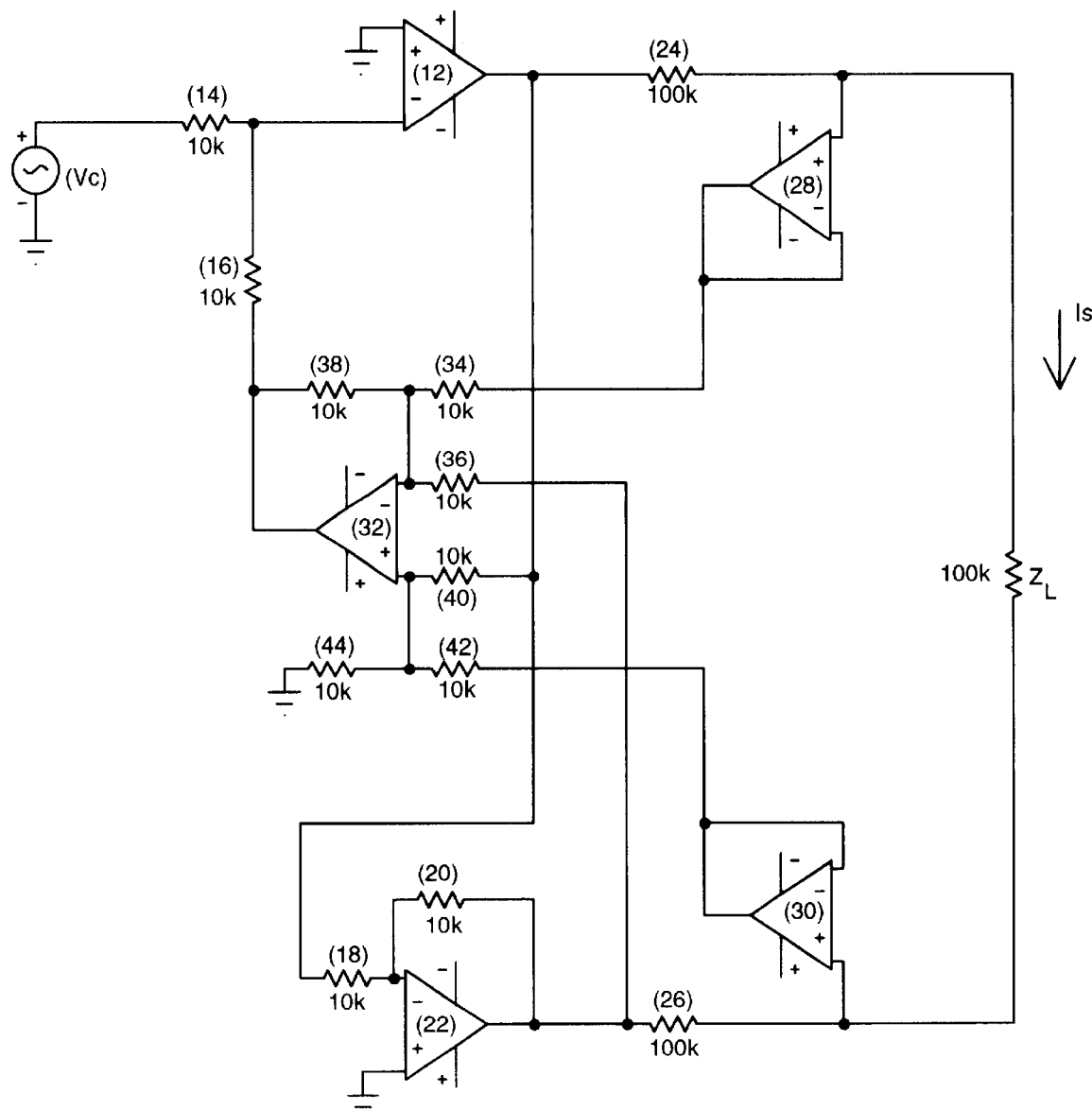
FIG. 2 is a schematic diagram of the prior art, differential current source that can drive a floating load differentially.
Figure 3:
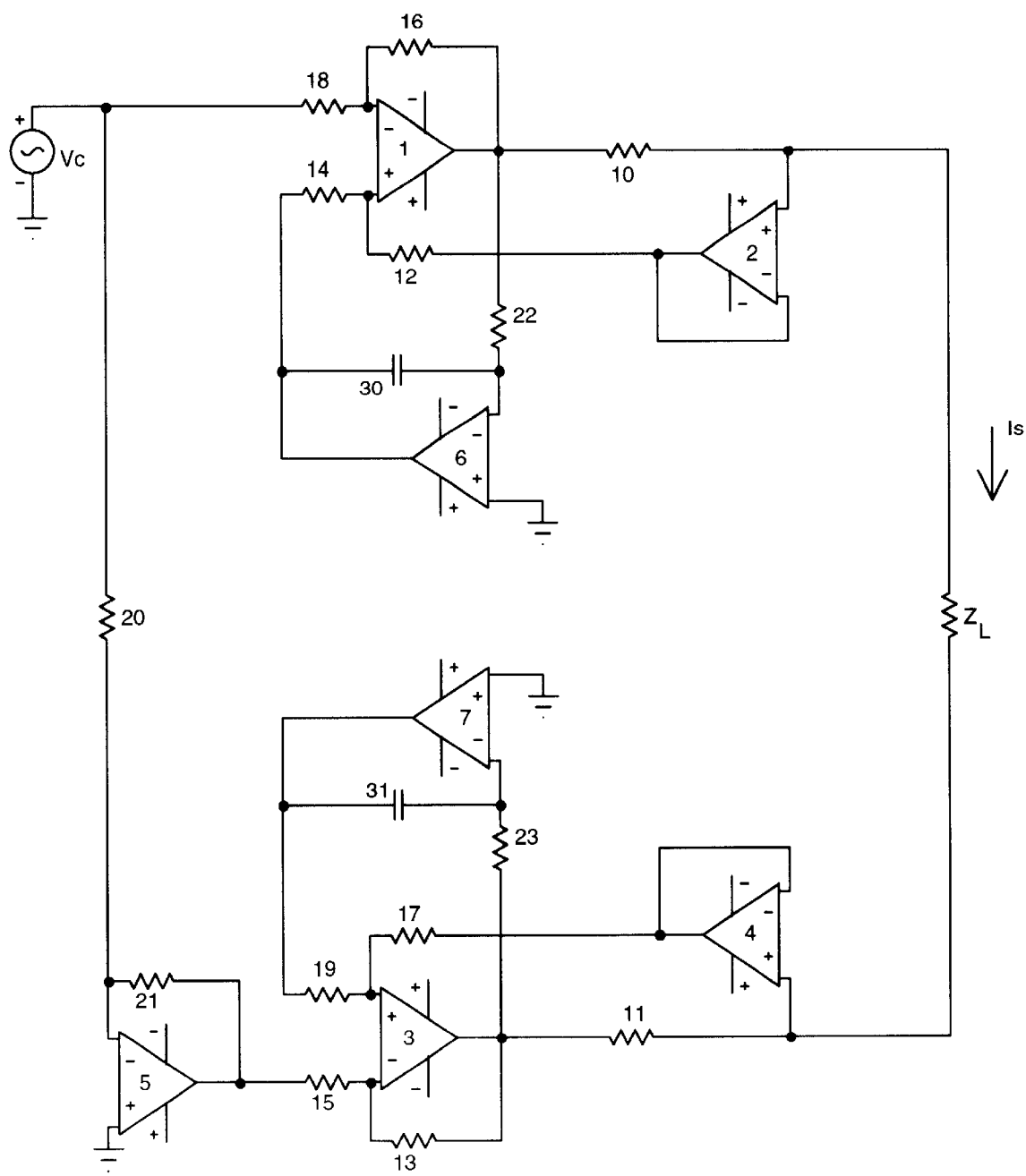
FIG. 3 is a schematic diagram of one embodiment of the present invention configured for low frequency AC operation, with active common mode reduction circuitry omitted for clarity.

Referring to FIG. 3, one embodiment of the present invention is illustrated as being configured for bipolar, low frequency AC operation into a resistive load. This embodiment is particularly useful in applications where the output current remains unchanged or can be easily scaled by changing the control voltage Vc. It represents a voltage controlled current source for producing a desired load current which flows through a selected load impedance, the load current being a function of a provided input voltage and being substantially independent of the value chosen for the load impedance, that will operate as either a differential current source for a floating load or a grounded current source if one end of the load is grounded, the current source comprised of two symmetrical halves that drive each end of the load, a means of centering operation (operating voltage) between amplifier power supplies, and a means of automatically and continuously minimizing average DC voltage of an AC current source without manual adjustment.

The differential current source has two halves, one to drive each end of the load. The drive current, Is, from the first half consisting of amplifiers 1, 2 and 6 through a load, ZL, is based on the following equation:

$$I_s = V_c/R,$$

where Vc is a control voltage, and R is a sense resistor 10. The second half of the current source sinks current, Is, from the load, ZL, based on the equation:

$$I_s = -V_c/R,$$

where −Vc is control voltage Vc inverted by amplifier 5 and resistors 20 and 21, and R is sense resistor 11.

Operation of the first half of the differential current source begins with a voltage from Vc being presented at the inverting input of op-amp 1 through resistor 18. Op-amp 1 changes its output voltage to make the voltage at its non-inverting input equal the voltage at its inverting input. The voltage at the output of op-amp 1 causes current to flow through resistor 10 and then through the load ZL. If resistor 14 is assumed grounded, it is obvious that the voltage across resistor 10 must be equal to Vc in order for the inputs of op-amp one to be equal because one side of 10 is summed to the inverting input through resistor 16 and the other side is summed into the non-inverting input through resistor 12, buffered by amplifier 2 in a voltage follower configuration. The output current, Is, through the load, ZL, can be predicted as Vc divided by the resistance of 10. In one embodiment, a means of centering an operating voltage between power supply rails is comprised of amplifier 6, resistor 22, capacitor 30, resistor 14, and symmetric-ally-related components 7, 23, 31, and 19. For example, amplifier 6 is configured as an integrator using resistor 22 and capacitor 30 with a time constant that is set much slower than the expected operating frequency of the AC current source so the integrator can monitor the DC average voltage present at the output of op-amp 1 and feed back voltage through resistor 14 to reduce DC error.

This DC correction circuitry has two advantages. A first advantage is that the DC correction circuitry centers the common-mode operating point and prevents the combined current sources from floating to one of the power supply rails. Secondly, the DC correction circuitry reduces the average DC current of the source to a very small amount determined by op-amp 6's input offset voltage divided by the current sample resistor 10; i.e., provides a means of minimizing average DC voltage of an AC current source, without manual adjustment of the current source. The minimization of DC current is very important in low-level AC measurements.

Similar to the first half, operation of the second half of the differential current source begins with a voltage from Vc being inverted by amplifier 5 and resistors 20 and 21 then continuing to the inverting input of op-amp 3 through resistor 15. Op-amp 3 changes its output voltage to make the voltage at its non-inverting input equal the voltage at its inverting input. The voltage at the output of op-amp 3 causes current to flow through resistor 11 and then through the load ZL. If resistor 19 is assumed grounded, it is apparent that the voltage across resistor 11 must be equal to −Vc in order for the inputs of op-amp 1 to be equal because one side of 11 is summed to the inverting input through resistor 13 and the other side is summed into the non-inverting input through resistor 17, buffered by amplifier 4 in a voltage follower configuration. The output current, Is, through the load, ZL, can be predicted as Vc divided by the resistance of 11. Amplifier 7 is configured as an integrator using resistor 23, and capacitor 31 with a time constant is set much slower than the expected operating frequency of the AC current source so the integrator can monitor the DC average voltage present at the output of op-amp 3 and feed back voltage through resistor 19 to reduce DC error. If the current produced by each half of the source is different because component tolerance the actual current, Is, is the average of the current sourced by the two halves. If one side of the load, ZL, is connected to ground, the source that drives that side will effectively drive current directly into ground and the other half will provide its full current to the load. If one half of the load, ZL, is grounded through a resistance such as lead resistance, the two halves will both drive the load and the source current, Is, will be between the current driven by the ungrounded half and the average of the two halves.

As apparent to those skilled in the art, the voltage controlled current source according to the present invention may be further modified, using methods known in the art, to be configured for an operation selected from the group consisting of unipolar operation, bipolar operation, AC operation, DC operation, operation with resistive loads, operation with reactive loads, and a combination thereof. For example, for unipolar operation, the control voltage Vc should remain positive rather than being bipolar. For DC operation, the DC correction circuits, including amplifiers 6 and 7 that act on each half of the current source independently, must be replaced by a centering circuit that accounts for the operating point of the two halves together. While there may be various ways to configure the modified circuit, one method is to construct the modified circuit in a similar manner as the active common mode reduction circuit illustrated in FIG. 4. Driving reactive loads would require tuning the current source for phase stability.

Figure 4:
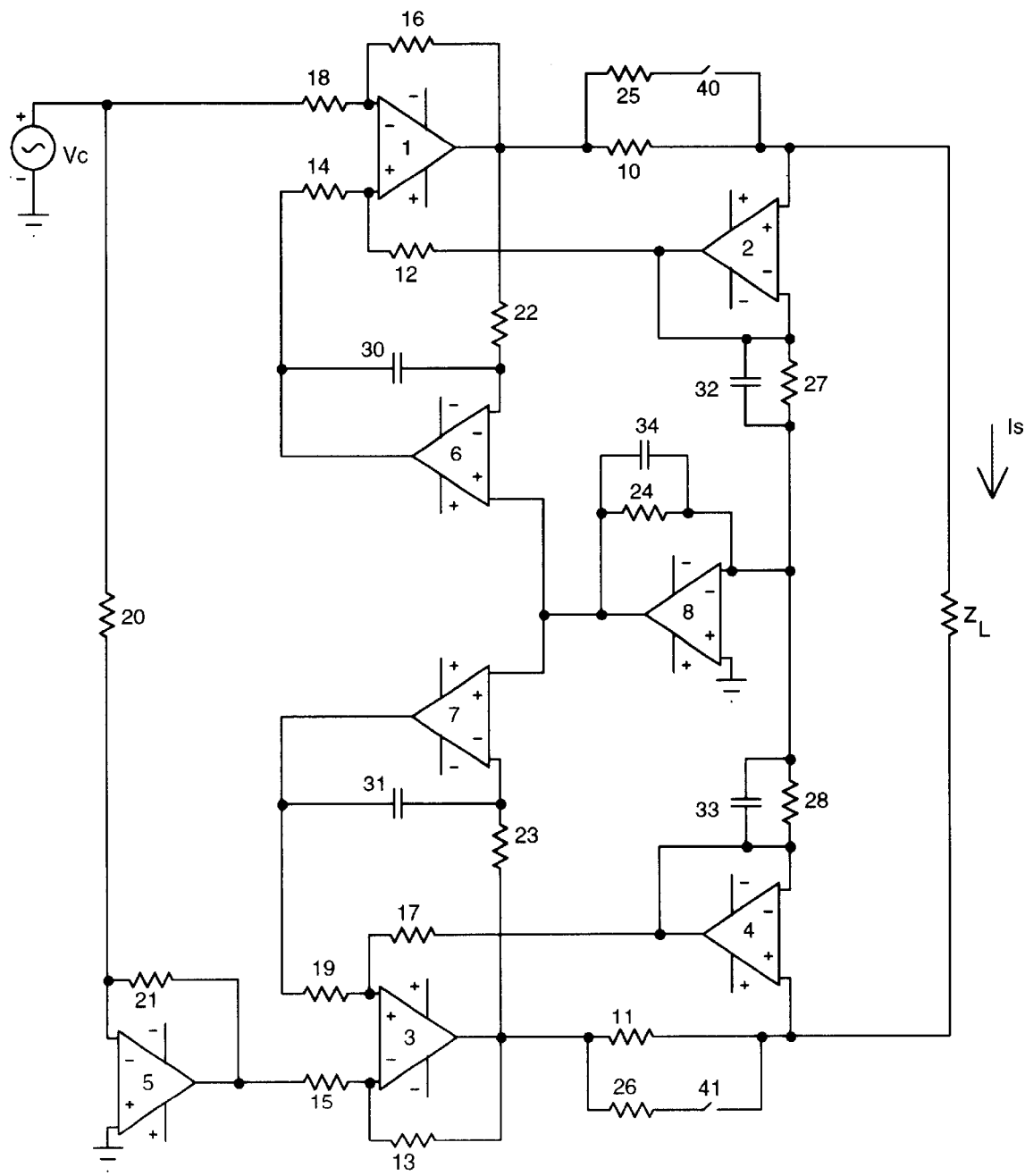
FIG. 4 is a schematic diagram of a second embodiment of the present invention configured for low frequency AC operation, including active common mode reduction circuits.

In referring to FIG. 4, a second embodiment of the present invention is illustrated as being configured for bipolar, low frequency AC operation into a resistive load. The second embodiment comprises the current source illustrated in FIG. 3 which has been modified to further include one or more features selected from the group consisting of range switching, and active common mode reduction. For example, compared to the current source shown in FIG. 3, the current source illustrated in FIG. 4 further comprises sense resistors 25 & 26, and switching means known in the art (e.g., corresponding switches 40 & 41). Resistors 25 and 26 can be switched in to establish a new current range in comprising range switching in the current source. This embodiment is useful in applications where the output current changes over more than one order of magnitude or cannot be easily scaled by changing the control voltage Vc. It is particularly useful in applications that require very low current and will benefit from active common mode reduction in addition to with the common mode protection offered by a differential current source. It represents the voltage controlled current source of the first embodiment that can be easily modified for range selection by any sense resistor value selection. It also demonstrates how the voltage controlled current source of the first embodiment can be further improved by the addition of active common mode reduction that is switchable and scalable. For example, active common mode reduction may comprise a means of sensing common mode voltage (e.g., resistors 27 & 28, or by other suitable means known in the art), a means of scaling the common mode voltage (e.g., resistor 24, or by other suitable means known in the art), a means of feeding back the scaled common mode voltage to bias the operating point of the current source (feeding back the result to op-amps 6 & 7, or by other suitable means known in the art), and a means of turning off common mode reduction for grounded load operation (e.g., reduction of resistor 24 to zero ohms or by other suitable means known in the art).

Given that the drive current, Is, from the first half consisting of amplifiers 1, 2 and 6 through a load, ZL, is based on the following equation:

$$Is=Vc/R,$$

where Vc is a control voltage and R is a sense resistor 10 it follows that the current can be changed by changing either Vc or R. Resistor 25 and switch 40 demonstrate a plurality of resistors and switches that can be used to change current by changing R on the first half of the current source. Similarly, resistor 26 and switch 41 demonstrate a plurality of resistors and switches that can be used to change current by changing R on the second half of the current source. The common-mode reduction circuit actively cancels common mode voltages by reducing the output impedance of the current source to common mode signals while continuing to drive a floating load with high impedance. Resistors 27 and 28 feed the buffered voltage signals from amplifiers 2 and 4 to the inverting input of amplifier 8. The output of 8 can be expressed as:

$$Out(8)=-R(24)*((Out(2)/27)+(Out(4)/28))$$

and is proportional to only the common-mode voltage present upon ZL because the normal mode voltages are of opposite sign and cancel each other. This inverted, common-mode signal is fed to the non-inverting inputs of amplifiers 6 and 7. This action causes the outputs of amplifiers 1 and 3 to move in a direction that opposes the sensed common mode voltage. Resistors 27 and 28 are equal values for symmetry of action and the ratio of resistors 24 to resistors 27 and 28 can be scaled for different levels of reduction. Common mode reduction can be effectively turned off by reducing resistor 24 to 0 ohms. Capacitors 32, 33 and 34 provide stability at high frequencies.

The foregoing description of the specific embodiments of the present invention has been described in detail for purposes of illustration. In view of the descriptions and illustrations, others skilled in the art can, by applying, current knowledge, readily modify and/or adapt the present invention for various applications without departing from the basic concept, and therefore such modifications and/or adaptations are intended to be within the meaning and scope of the appended claims.

What is claimed:

1. A voltage controlled current source for producing a desired load current which flows through a selected load impedance, the load current being a function of provided input voltage and being substantially independent of the load impedance; wherein the voltage controlled current source can operate as a differential current source for a floating load or as a grounded load current source when one end of the load is grounded; and wherein the voltage controlled current source comprises:

a) two symmetrical halves that drive each end of the load;
   b) a means of centering an operating voltage between power supply rails; and
   c) a means of minimizing average DC voltage of an AC current source without manual adjustment.

2. The voltage controlled current source according to claim 1, wherein the voltage controlled current source is configured for an operation selected from the group consisting of AC operation, DC operation, unipolar operation, bipolar operation, operation with a resistive load, operation with a reactive load, and a combination thereof.

3. The voltage controlled current source according to claim 1, further comprising a plurality of sense resistors and switching means in providing a range switching feature.

4. The voltage controlled current source according to claim 1, further comprising active common mode reduction.

5. A voltage controlled current source for producing a desired load current which flows through a selected load impedance, the load current being a function of provided input voltage and being substantially independent of the load impedance; wherein the voltage controlled current source can operate as a differential current source for a floating load or as a grounded load current source when one end of the load is grounded; and wherein the voltage controlled current source comprises:

a) two symmetrical halves that drive each end of the load;
   b) a means of centering an operating voltage between power supply rails;
   c) a means of minimizing average DC voltage of an AC current source without manual adjustment;
   d) a plurality of sense resistors and switching means in providing a range switching feature; and
   e) active common mode reduction.

6. The voltage controlled current source according to claim 5, wherein the voltage controlled current source is configured for an operation selected from the group consisting of AC operation, DC operation, unipolar operation, bipolar operation, operation with a resistive load, operation with a reactive load, and a combination thereof.

* * * * *